United States Patent
Yoshida

(10) Patent No.: US 7,460,325 B2
(45) Date of Patent: *Dec. 2, 2008

(54) INFORMATION RECORDING/REPRODUCTION APPARATUS HAVING HARD DISK DEVICE INCORPORATED THEREIN

(75) Inventor: Shinji Yoshida, Daito (JP)

(73) Assignee: Funai Electric Co., Ltd., Osaka (JP)

( * ) Notice: Subject to any disclaimer, the term of this patent is extended or adjusted under 35 U.S.C. 154(b) by 170 days.

This patent is subject to a terminal disclaimer.

(21) Appl. No.: 11/480,796

(22) Filed: Jul. 3, 2006

(65) Prior Publication Data

US 2007/0012614 A1    Jan. 18, 2007

(30) Foreign Application Priority Data

Jul. 15, 2005   (JP) ............................ 2005-207308

(51) Int. Cl.
G11B 15/18 (2006.01)
G06F 1/20 (2006.01)

(52) U.S. Cl. ........................................ 360/69; 361/687

(58) Field of Classification Search ................. None
See application file for complete search history.

(56) References Cited

U.S. PATENT DOCUMENTS

| 6,295,264 | B1 * | 9/2001 | Kawakami | ................. 720/649 |
| 2004/0202534 | A1 * | 10/2004 | Inoue et al. | ................... 415/15 |
| 2007/0012615 | A1 * | 1/2007 | Yoshida | ...................... 210/411 |

FOREIGN PATENT DOCUMENTS

JP    2002-324391    11/2002

OTHER PUBLICATIONS

Patent Abstracts of Japan, Publication No. 2002-324391, Publication date Nov. 8, 2002 (1 page).

* cited by examiner

*Primary Examiner*—Jason C Olson
(74) *Attorney, Agent, or Firm*—Osha•Liang LLP

(57) ABSTRACT

A DVD recorder includes a control portion operating in response to a signal received from a monitor portion of a hard disk device and indicating how many times writing a data signal is retried. If the current retry count is at least a predetermined number of times the control portion turns on a cooling fan device. If the current retry count is smaller than the predetermined number of times the control portion turns off the cooling fan device. As a signal output from the hard disk device can be utilized to control the cooling fan device, the apparatus can be less costly than that provided with a separate, dedicated temperature sensor, as conventional.

6 Claims, 5 Drawing Sheets

INFORMATION RECORDING/REPRODUCTION APPARATUS HAVING HARD DISK DEVICE INCORPORATED THEREIN

BACKGROUND

1. Field of the Invention

The present invention relates generally to information recording/reproduction apparatuses and particularly to information recording/reproduction apparatuses that employ an exchangeable optical disk and an incorporated hard disk device to record/reproduce information.

2. Description of the Background Art

Conventionally DVD recorders (information recording/reproduction apparatuses) generate heat for example at a mechanism causing an optical disk to rapidly rotate, an incorporated hard disk device, and the like. In order to prevent a casing from internally having excessively increased temperature and thus increase the apparatus in life and reliability, the temperature in the casing is sensed with a temperature sensor and a cooling fan device is controlled in accordance with a result of the sensing (see for example Japanese Patent Laying-Open No. 2002-324391).

To do so, however, conventional DVD recorders are provided with a temperature sensor dedicated to sensing the temperature in the casing. As such, they are costly.

SUMMARY OF THE INVENTION

The present invention therefore mainly contemplates a less costly information recording/reproduction apparatus.

In accordance with the present invention an information recording/reproduction apparatus is an information recording/reproduction apparatus employing an exchangeable optical disk and an incorporated hard disk device to record/reproduce information, the hard disk device including an optical disk, a first write/read portion writing/reading a data signal to/from the optical disk, a temperature sensor sensing temperature in a casing of the hard disk device, and a monitor portion outputting a first signal indicating how many times writing the data signal is retried and a second signal indicating a result of sensing by the temperature sensor, the information recording/reproduction apparatus including: a second write/read portion writing/reading a data signal to/from the optical disk; a cooling fan device for cooling an interior of the casing of the information recording/reproduction apparatus; and a control portion receiving the first and second signals output from the hard disk device to drive the cooling fan device when the second signal indicates a temperature exceeding a predetermined temperature after the first signal indicates that writing the data signal is retried more than a predetermined number of times.

In the present information recording/reproduction apparatus the hard disk device outputs a first signal indicating how many times writing the data signal is retried and a second signal indicating a result of sensing by an incorporated temperature sensor and the control portion drives a cooling fan device when the second signal indicates a temperature exceeding a predetermined temperature after the first signal indicates that writing the data signal is retried more than a predetermined number of times. As the cooling fan device can be controlled as based on a signal output from the hard disk device, a separately provided, dedicated temperature sensor can be dispensed with and reduced cost can be achieved. Furthermore, as the cooling fan device can be driven when a retry count exceeding a predetermined number of times is reached and temperature exceeds a predetermined temperature, the cooling fan device can be driven after it is confirmed that an increased retry count is attributed to increased temperature. The power otherwise wastefully consumed can thus be saved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
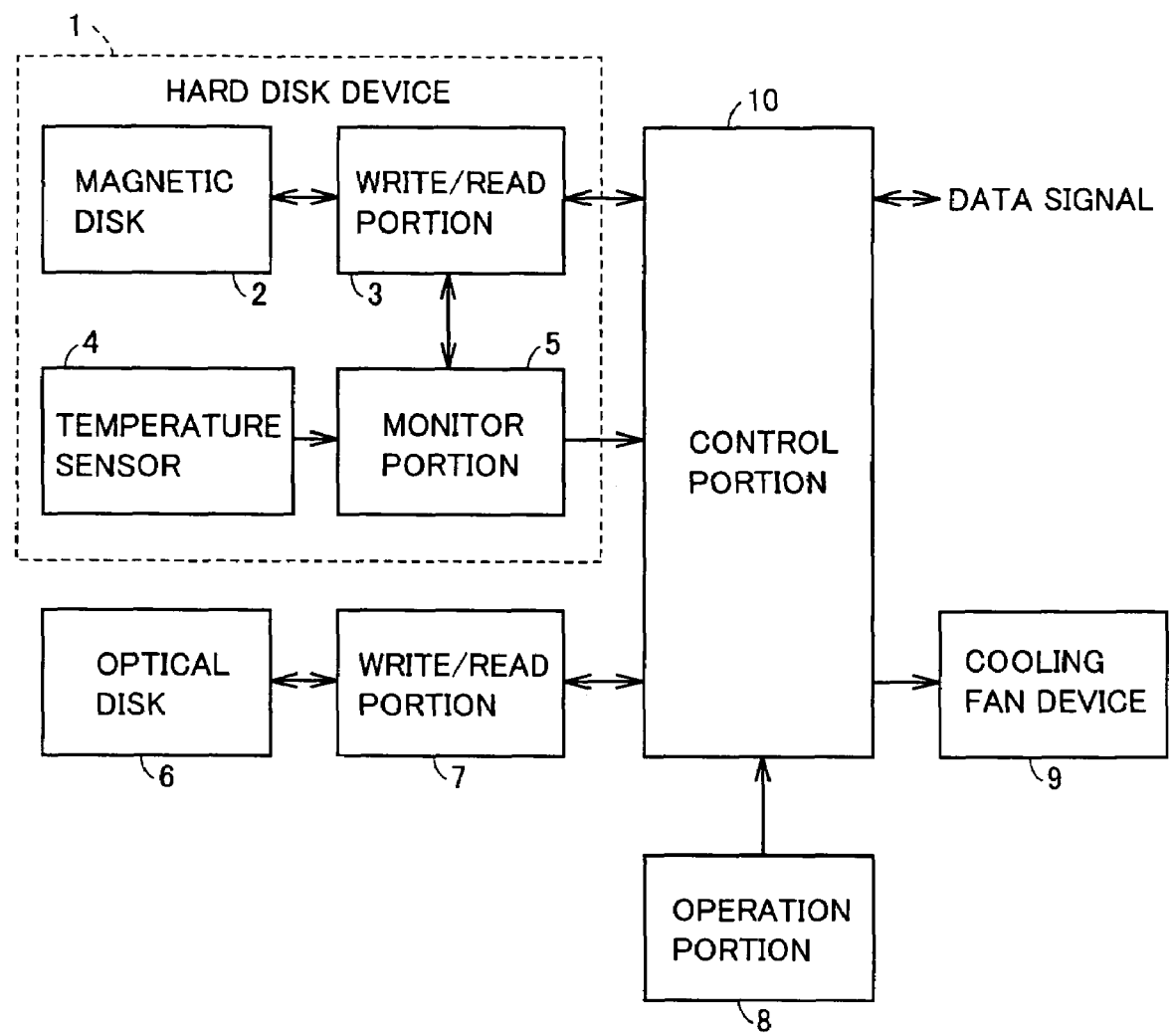
FIG. 1 is a block diagram showing a main portion of a DVD recorder in a first embodiment of the present invention.

FIG. 1 is a block diagram showing a main portion of a DVD recorder in a first embodiment of the present invention. In FIG. 1 the DVD recorder includes a hard disk device 1, an optical disk 6, a write/read portion 7, an operation portion 8, a cooling fan device 9, and a control portion 10.

Hard disk device 1 is a commercially available as a discrete component including a casing in the form of a rectangular parallelepiped (not shown), and a magnetic disk 2, a write/read portion 3, a temperature sensor 4 and a monitor portion 5 accommodated in the casing.

Write/read portion 3 includes a spindle motor rotatably driving magnetic disk 2, a head that performs a write/a read, a head actuator having the head mounted thereto, a voice coil motor driving the head actuator, a CPU controlling them, and the like. Write/read portion 3 operates in response to a variety of control signals received from control portion 10 and monitor portion 5 to write to magnetic disk 2 a data signal provided via control portion 10 and also read from magnetic disk 2 and provide to control portion 10 a data signal of an address designated by control portion 10.

Temperature sensor 4 senses temperature in the casing of hard disk device 1 at a predetermined location and provides to monitor portion 5 a signal indicating the sensed temperature. Monitor portion 5 monitors the signal received from temperature sensor 4, an operation of write/read portion 3, and the like, and in accordance with a result of the monitoring controls a condition for the operation of write/read portion 3 and also provides to control portion 10 a signal indicating the result of the monitoring. The signal indicating the result of the monitoring includes a signal indicating the temperature sensed by temperature sensor 4, a signal indicating how many times write/read portion 3 retries to write a data signal.

Optical disk 6 is provided to be readily exchangeable by a user, and includes a DVD-RAM (repeatedly readable and writable), a DVD-R (write once), a DVD-RW (repetitively rewritable) and the like.

Write/read portion 7 includes a spindle motor rotatably driving optical disk 6, an optical pickup performing a write/a read, a feeding motor moving the optical pickup, and the like. Write/read portion 7 operates in response to a variety of control signals received from control portion 10 to write to optical disk 6 a data signal provided via control portion 10 and also read from optical disk 6 and provide to control portion 10 a data signal of an address designated by control portion 10.

Operation portion 8 includes a variety of keys operated to perform recording, reproduction, rewinding, fast-forwarding, programming of recording, and the like, and provides to control portion 10 a signal indicating a key operated by a user. Cooling fan device 9 is provided internal to the casing of the DVD recorder and includes a fan, a motor for rotating the fan, a drive portion driving the motor, and the like. Cooling fan device 9 is controlled by control portion 10 to ventilate the interior of the casing of the DVD recorder and also send cold air to a heat generating portion to prevent temperature from increasing.

Control portion 10 operates in response to a signal received from operation portion 8 to write/read a data signal to/from hard disk device 1 and also write/read a data signal to/from optical disk 6 to record/reproduce a video image or the like.

Employing hard disk device 1, which is large in capacity and high in speed, for performing long, time-shift recording, and employing optical disk 6, which is exchangeable, to record a program that a user desires to store for a long period of time, allow the merits of both hard disk device 1 and optical disk 6 to be both exploited.

Figure 2:
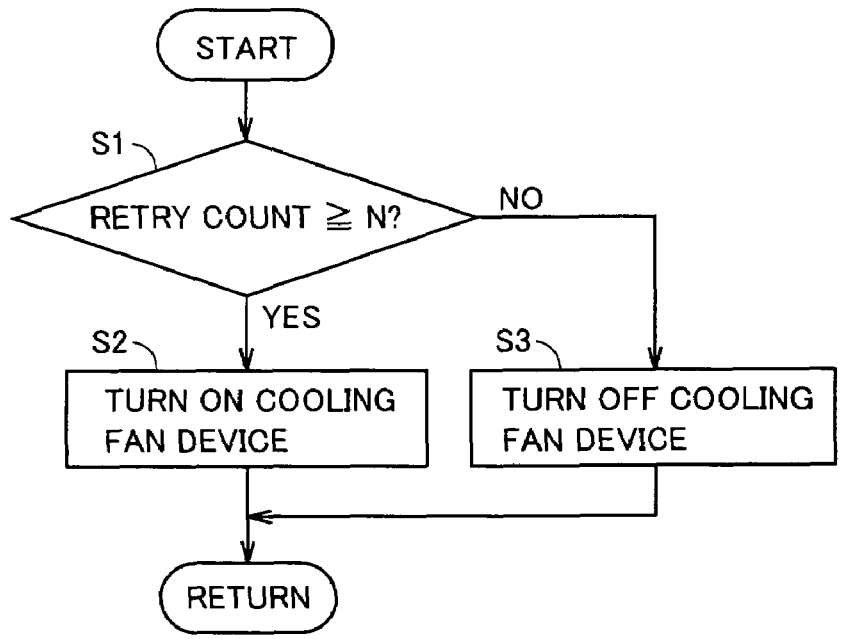
FIG. 2 is a flow chart for illustrating an operation of a control portion shown in FIG. 1.

Furthermore control portion 10 controls cooling fan device 9 in response to a signal provided from monitor portion 5 of hard disk device 1 and indicating how may times a write is retried. More specifically, as shown in FIG. 2, control portion 10 at step S1 determines whether the current retry count is at least a predetermined number of times N and if so control portion 10 proceeds to step S2 to turn on cooling fan device 9 to start to send air to a heat generating portion. If the current retry count is smaller than the predetermined number of times N then control portion 10 proceeds to step S3 to turn off cooling fan device 9 to stop sending air to the heat generating portion. This is done by exploiting the fact that as the temperature in hard disk device 1 increases, magnetic disk 2 has a magnetic characteristics degraded and a write is accordingly retried an increased number of times.

This can prevent excessively increased temperature in the casing of the DVD recorder to increase and enhance the apparatus in life and reliability, respectively. Furthermore, as cooling fan device 9 can be controlled as based on a signal output from hard disk device 1, the apparatus can be less costly than that provided with a temperature sensor dedicated for sensing the temperature internal to the casing, as conventional.

Figure 3:
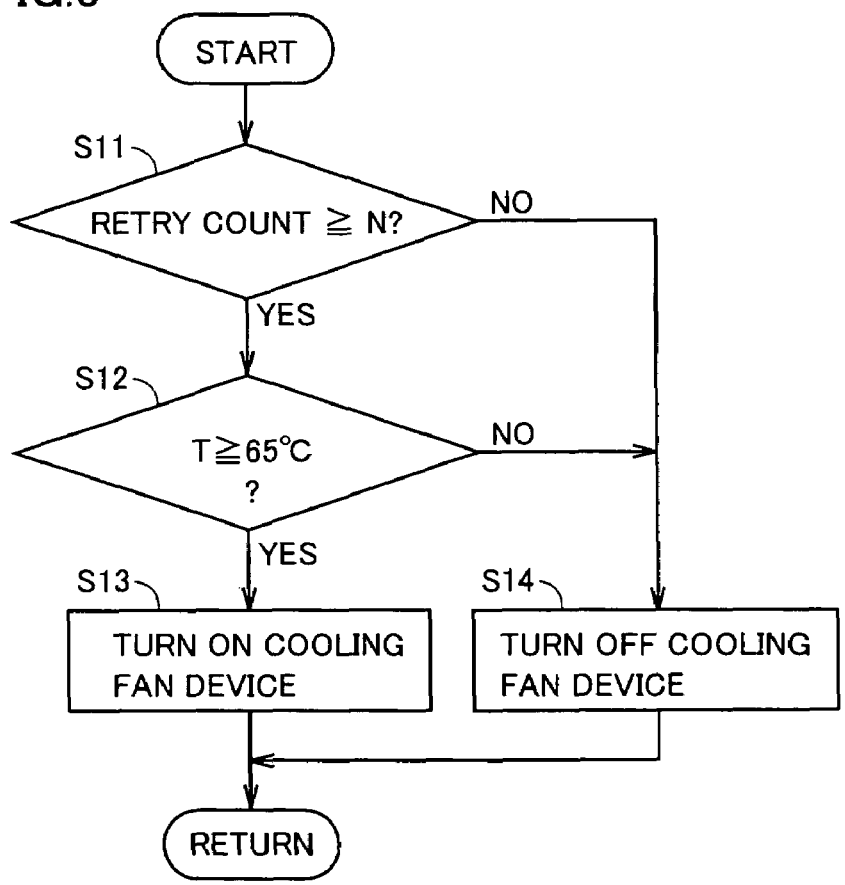
FIG. 3 is a flow chart for illustrating an exemplary variation of the first embodiment.

FIG. 3 is a flow chart for illustrating an exemplary variation of the first embodiment. In this exemplary variation, control portion 10 controls cooling fan device 9 in accordance with a signal provided from temperature sensor 4 via monitor portion 5 and indicating the temperature in the casing of hard disk device 1 and a signal provided from monitor portion 5 and indicating a retry count. More specifically, control portion 10 at step S11 determines whether the current retry count is at least a predetermined number of times N and if so control portion 10 proceeds to step S12 to determines whether temperature T sensed by temperature sensor 4 is at least 65° C. and if so control portion 10 proceeds to step S13 to turn on cooling fan device 9 to start to send air to a heat generating portion. If at step S11 the current retry count is smaller than the predetermined number of times N or at step S12 temperature T as sensed is lower than 65° C. then control portion 10 proceeds to step S14 to turn off cooling fan device 9 to stop sending air to the heat generating portion.

This exemplary variation can achieve the same effect as the first embodiment and also allows cooling fan device 9 to be turned on after it is confirmed that an increased retry count is attributed to increased temperature. The power otherwise wastefully consumed can thus be saved.

Figure 4:
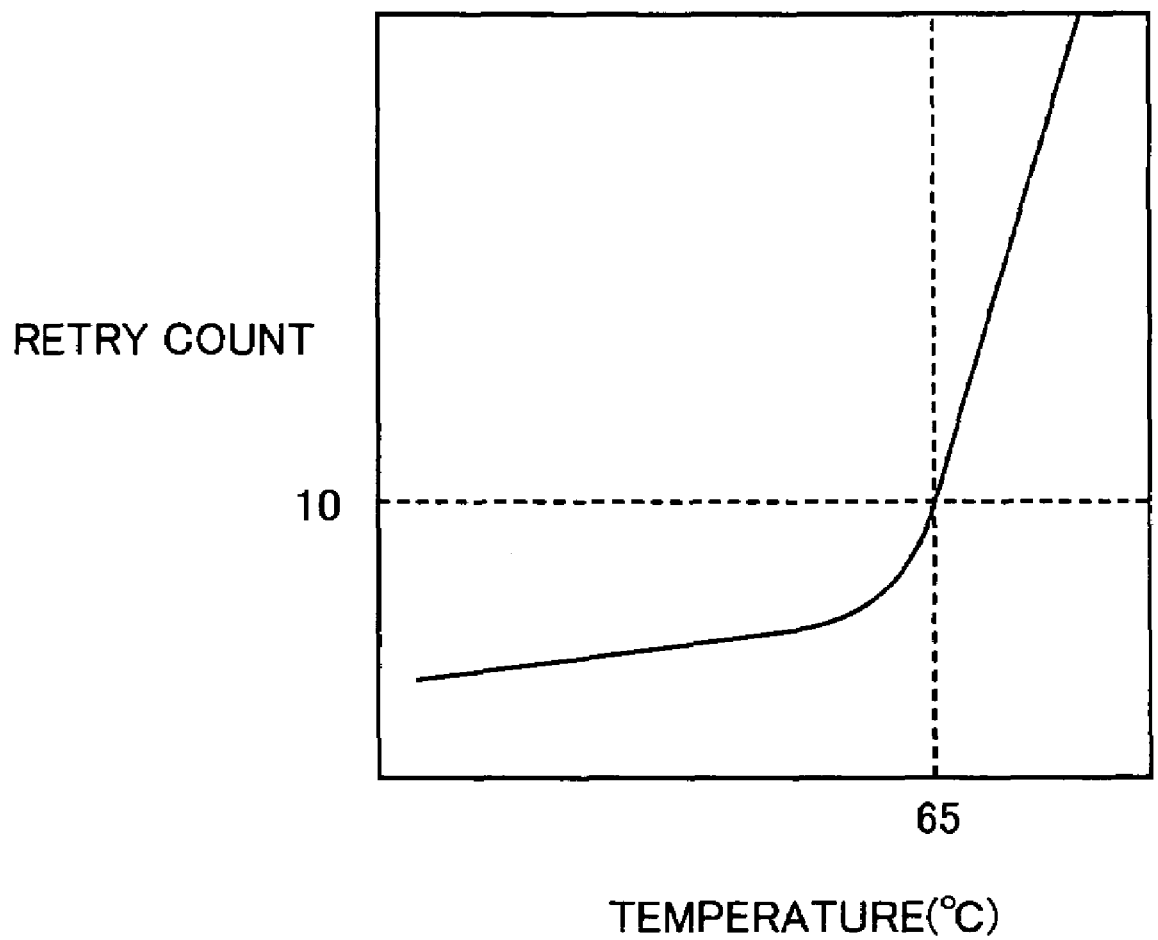
FIG. 4 represents a relationship between the temperature of the hard disk device shown in FIG. 1 and retry count.

Note that FIG. 4 represents a correlation between the temperature of hard disk device 1 as measured and retry count. It can be seen from FIG. 4 that retry count rapidly increases when the temperature of hard disk device 1 it exceeds a temperature (in FIG. 4, 650C).

Second Embodiment

Figure 5:
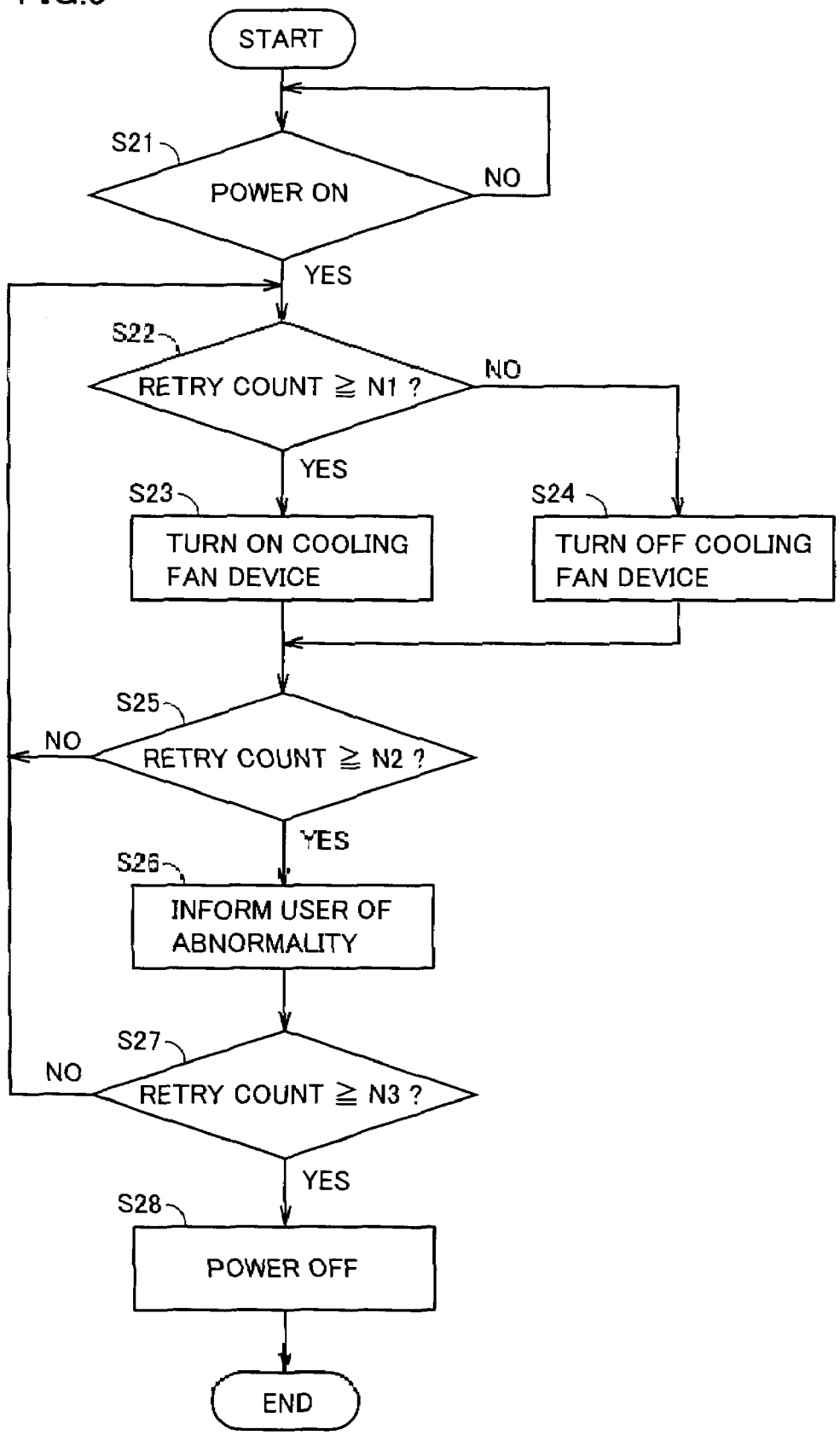
FIG. 5 is a flow chart for illustrating an operation of a control portion of a DVD recorder in a second embodiment of the present invention.

FIG. 5 is a flow chart for illustrating an operation of control portion 10 of a DVD recorder in a second embodiment of the present invention. The DVD recorder has a configuration identical to that shown in FIG. 1. In FIG. 5 control portion 10 controls cooling fan device 9 and the DVD recorder in response to a signal provided via monitor portion 5 and indicating how many times a write is retried. More specifically, control portion 10 at step S21 waits until the DVD recorder is powered on. When the DVD recorder is powered on, control portion 10 proceeds to step S22 to determine whether the current retry count is at least a predetermined number of times N1 and if so then control portion 10 proceeds to step S23 to turn on cooling fan 9 to start to send air to a heat generating portion. If the current retry count is smaller than the predetermined number of times N1 then control portion 10 proceeds to step S24 to turn off cooling fan device 9 to stop sending air to the heat generating portion.

Then at step at S25 control portion 10 determines whether the current retry count is at least a predetermined number of times N2 larger than the predetermined number of times N1 and if not control portion 10 returns to step S22. If the current retry count is at least the predetermined number of times N2 then control portion 10 determines that cooling fan device 9 or the like has a defect, and control portion 10 proceeds to step S26 to inform the user by an audible alarm, an alarming lamp or the like that the DVD recorder has abnormality. The user determines that the DVD recorder has a defect, and stops using the recorder and requests a distributer or the like to repair it.

Then at step S27 control portion 10 determines whether the current retry count is at least a predetermined number of times N3 larger than the predetermined number of times N2 and if not control portion 10 returns to step S22. If the current retry count is at least the predetermined number of times N3 control portion 10 determines that the user is not aware of the audible alarm or the like and control portion 10 proceeds to step S28 to power off the DVD recorder.

The second embodiment can also provide the same effect as the first embodiment.

Figure 6:
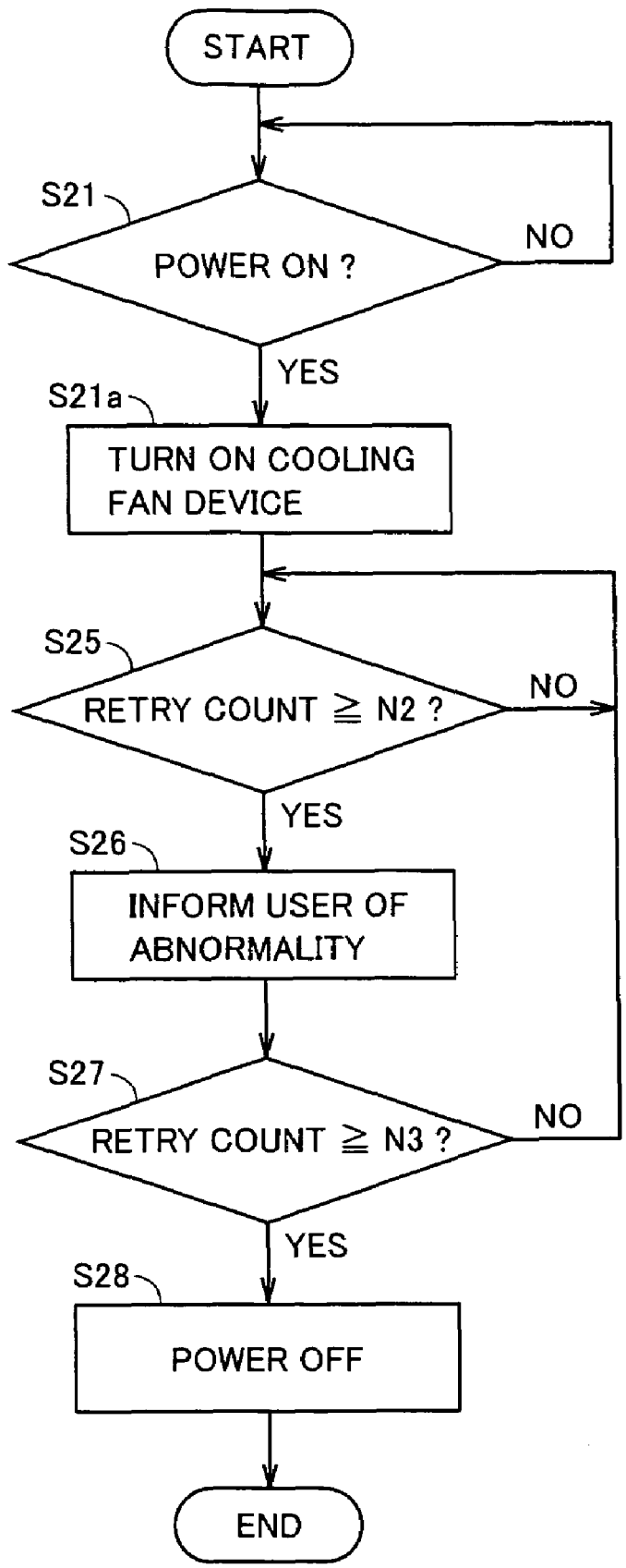
FIG. 6 is a flow chart for illustrating an exemplary variation of the second embodiment.

FIG. 6 is a flow chart for illustrating an exemplary variation of the second embodiment. The FIG. 6 flows chart differs from the FIG. 5 flow chart in that steps S22-S24 are removed and after step S21 step S21a is added. In this exemplary variation if at step S21 a power supply is turned on then cooling fan device 9 is turned on regardless of temperature T sensed by temperature sensor 4. If at step S28 the power supply is turned off then the power supplied to cooling fan device 9 is also turned off and cooling fan device 9 is thus stopped. This exemplary variation can simplify control by steps S22-S24.

Note that the first and second embodiments have been described with the present invention applied to a DVD recorder, it is needless to say that the present invention is also applicable to any information recording/reproduction apparatuses that employ an exchangeable storage medium and an incorporated hard disk device to record/reproduce information, such as personal computers. The exchangeable storage medium is not limited to an optical disk; it may be a large-capacity semiconductor memory, a magnetic disk, or video tape.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An information recording/reproduction apparatus employing an optical disk and an incorporated hard disk device to record/reproduce information, said hard disk device including, a magnetic disk, a first write/read portion writing/reading a data signal to/from said magnetic disk, a temperature sensor sensing temperature in a casing of said hard disk device, and a monitor portion outputting a first signal indicating how many times writing said data signal is retried and a second signal indicating a result of sensing by said temperature sensor, the information recording/reproduction apparatus comprising:

a second write/read portion writing/reading a data signal to/from said optical disk;

a cooling fan device for cooling an interior of a casing of the information recording/reproduction apparatus; and a control portion receiving said first and second signals output from said hard disk device to drive said cooling fan device when said second signal indicates a temperature exceeding a predetermined temperature after said first signal indicates that writing said data signal is retried more than a predetermined number of times.

2. An information recording/reproduction apparatus employing an exchangeable storage medium and an incorporated hard disk device to record/reproduce information, said hard disk device outputting a first signal indicating how many times writing said data signal is retried, the information recording/reproduction apparatus comprising:

a cooling fan device for cooling an interior of a casing of the information recording/reproduction apparatus; and a control portion controlling said cooling fan device in response to said first signal output from said hard disk device.

3. The information recording/reproduction apparatus according to claim 2, wherein said control portion drives said cooling fan device when said first signal indicates that writing said data signal is retried more than a predetermined number of times.

4. The information recording/reproduction apparatus according to claim 2, wherein:

said hard disk device further outputs a second signal indicating a result of sensing by an incorporated temperature sensor; and said control portion drives said cooling fan device when said second signal indicates a temperature exceeding a predetermined temperature after said first signal indicates that writing said data signal is retried more than a predetermined number of times.

5. The information recording/reproduction apparatus according to claim 2, wherein:

when said first signal indicates that writing said data signal is retried more than a first number of times, said control portion drives said cooling fan device;

when said first signal indicates that writing said data signal is retried more than a second number of times larger than said first number of times, said control portion informs a user that the information recording/reproduction apparatus has abnormality; and when said first signal indicates that writing said data signal is retried more than a third number of times larger than said second number of times, control portion powers off the information recording/reproduction apparatus.

6. The information recording/reproduction apparatus according to claim 2, wherein:

when the information recording/reproduction apparatus is powered on, said control portion responsively drives said cooling fan device;

when said first signal indicates that writing said data signal is retried more than a first predetermined number of times, said control portion informs a user that the information recording/reproduction apparatus has abnormality; and when said first signal indicates that writing said data signal is retried more than a second number of times larger than said first number of times, control portion powers off the information recording/reproduction apparatus.

* * * * *